United States Patent
Saeed et al.

(10) Patent No.: US 9,837,991 B2
(45) Date of Patent: Dec. 5, 2017

(54) ADAPTIVE FILTER FOR SYSTEM IDENTIFICATION

(71) Applicant: KING FAHD UNIVERSITY OF PETROLEUM AND MINERALS, Dhahran (SA)

(72) Inventors: Muhammad Omer Bin Saeed, Dhahran (SA); Azzedine Zerguine, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 61 days.

(21) Appl. No.: 14/726,410

(22) Filed: May 29, 2015

(65) Prior Publication Data

US 2015/0263701 A1    Sep. 17, 2015

Related U.S. Application Data

(63) Continuation-in-part of application No. 13/860,468, filed on Apr. 10, 2013, now abandoned.

(51) Int. Cl.
*G06F 17/10* (2006.01)
*H03H 21/00* (2006.01)

(52) U.S. Cl.
CPC . *H03H 21/0043* (2013.01); *H03H 2021/0061* (2013.01); *H03H 2021/0089* (2013.01)

(58) Field of Classification Search
CPC ............... H03H 2021/0056–2021/0065; H03H 17/0255
USPC ........................................................ 708/322
See application file for complete search history.

(56) References Cited

U.S. PATENT DOCUMENTS

| | | | |
|---|---|---|---|
| 5,475,632 A | * | 12/1995 | Sugiyama .......... H03H 21/0012 708/322 |
| 5,887,059 A | | 3/1999 | Xie et al. |
| 6,026,121 A | | 2/2000 | Sadjadpour |
| 6,377,611 B1 | | 4/2002 | Hwang |
| 6,741,707 B2 | | 5/2004 | Ray et al. |
| 7,076,513 B2 | | 7/2006 | Staszewski |

(Continued)

FOREIGN PATENT DOCUMENTS

WO     WO 2006101997 A2     9/2006

OTHER PUBLICATIONS

Kwong, Raymond, A Variable Step Size LMS Algorithm, Jul. 1992, IEEE Transactions on Signal Processing, vol. 40, No. 7, pp. 1633-1642.*

(Continued)

*Primary Examiner* — Tan V. Mai
(74) *Attorney, Agent, or Firm* — Oblon, McClelland, Maier & Neustadt, L.L.P.

(57) ABSTRACT

The adaptive filter for sparse system identification is an adaptive filter that uses an algorithm in the feedback loop that is designed to provide better performance when the unknown system model is sparse, i.e., when the filter has only a few non-zero coefficients, such as digital TV transmission channels and echo paths. The algorithm is a least mean square algorithm with filter coefficients updated at each iteration, as well as a step size that is also updated at each iteration. The adaptive filter may be implemented on a digital signal processor (DSP), an application-specific integrated circuit (ASIC), or by field-programmable gate arrays (FPGAs).

5 Claims, 4 Drawing Sheets

(56) References Cited

U.S. PATENT DOCUMENTS

| | | |
|---|---|---|
| 7,298,774 B2 | 11/2007 | Miyata et al. |
| 2002/0041678 A1 | 4/2002 | Basburg-Ertem et al. |
| 2005/0201457 A1 | 9/2005 | Allred et al. |
| 2008/0136645 A1 | 6/2008 | Lin et al. |
| 2008/0205503 A1 | 8/2008 | Cooke et al. |
| 2008/0260141 A1 | 10/2008 | Givens |
| 2012/0106357 A1 | 5/2012 | Zummo et al. |
| 2012/0135691 A1 | 5/2012 | Zerguine et al. |

OTHER PUBLICATIONS

Wikipedia, Inverter (Logic Gate), Oct. 16, 2011, pp. 1-3.*

Wikipedia, Adder (Electronics), Jan. 13, 2012, pp. 1-3.*

Azzedine Zerguine, Muhammad Moinuddin and Asrar U. H. Sheikh, "Multiple Access Interference Plus Noise Constrained Least Mean Square Algorithm", EUSIPCO 2008, 16th European Signal Processing Conference.

Muhammad Omer Bin Saeed, Azzedine Zerguine, and Salem A. Zummo, "Variable step-size least mean square algorithms over adaptive networks", 10th International Conference on Information Science, Signal Processing and their Applications (ISSPA 2010), pp. 381-384.

Muhammad Omer Bin Saeed, Azzedine Zerguine and Salem A. Zummo, "Noise Constrained Diffusion Least Mean Squares Over Adaptive Networks", Personal Indoor and Mobile Radio Communications (PIMRC), 2010 IEEE 21st International Symposium on, pp. 288-292.

Muhammad O. Bin Saeed, Azzedine Zerguine and Salam A. Zummo, "A Robust LMS Adaptive Algorithm Over Distributed Networks", Signals, Systems and Computers (Asilomar), 2011 Conference Record of the Forty Fifth Asilomar Conference on, pp. 547-550.

Yilun Chen, Yuantao Gu, and Alfred Hero III, "Sparse LMS for System Identification", Proc. of ICASSP '09 (2009), pp. 3125-3126.

\* cited by examiner

ADAPTIVE FILTER FOR SYSTEM IDENTIFICATION

CROSS-REFERENCE TO RELATED APPLICATION

This application is a continuation-in-part of U.S. patent application Ser. No. 13/860,468, filed on Apr. 10, 2013.

BACKGROUND OF THE INVENTION

1. Field of the Invention

The present invention relates generally to digital signal processing techniques, and particularly to an adaptive filter for system identification that uses a modified least mean squares algorithm with a variable step-size for fast convergence while preserving reasonable precision when the unknown system is sparse.

2. Description of the Related Art

In many electronic circuits, it is necessary to process an input signal through a filter to obtain the desired signal, e.g., to remove noise. The filter implements a transfer function. When the coefficients remain unchanged, the filter is static, and always processes the input signal in the same manner. However, in some applications it is desirable to dynamically change the transfer function in order to produce an output signal that is closer to the desired signal. This is accomplished by using an adaptive filter that compares the output signal of the filter to a reference signal that is an estimate of the desired signal, producing an error signal that is fed back and used to alter the coefficients of the transfer function. Adaptive filters are commonly implemented by digital signal processors, although they may also be implemented by an application specific integrated circuit (ASIC) or by field programmable gate arrays (FPGAs). Adaptive filters are used in a variety of applications, including channel estimation, noise cancellation, system identification, echo cancellation in audio and network systems, and signal prediction, to name a few.

In system identification applications, the goal is to specify the parameters of an unknown system model on the basis of measurements of the input signal and output response signals of the unknown system, which are used to generate error signals that adjust the adaptive filter to more closely correlate with the unknown system model. System identification refers to the process of learning more about the unknown system with each input-output cycle and adjusting the adaptive filter to incorporate the newly acquired knowledge about the unknown system.

Adaptive filters use a variety of algorithms in the feedback loop to recalculate and update the coefficients of the transfer function. One of the most commonly used algorithms is the least mean square (LMS) algorithm, which is easy to implement and generally produces a reasonably accurate output signal. The LMS algorithm, also known as the stochastic gradient algorithm, was introduced by Widrow and Huff around 1960, and basically provides that adjustments should be made at each sample time t according to:

$$h_{t+1} = h_t + 2\mu e_t x_t \quad (1)$$

where h is a vector of the filter coefficients, e is the error signal, x is the input signal, and $\mu$ is a step size. The step size $\mu$ is usually chosen to be between 0 and 1. From equation (1), both the speed of convergence and the error in the adjustment are both proportional to $\mu$. This results in a trade-off. The greater the value of $\mu$, the faster the convergence, but the greater the adjustment error. On the other hand, the smaller the value of $\mu$, the slower the convergence, but the closer the correlation to the unknown system. Both convergence time and the total misadjustment may also be affected by the length of the filter.

In system identification, the balance between convergence time and total misadjustment may also be affected by the quality of the unknown system. When the unknown system is sparse, many of the filter coefficients (tap weights controlling the magnitude each tap contributes to the output signal) will be zero or close to zero. Many attempts have been made to modify the LMS algorithm to exploit the sparseness of the system to produce faster convergence.

An algorithm recently proposed by Yilun Chen et al. in "Sparse LMS for System Identification", Proc. of ICASSP '09 (2009), pp. 3125-3128, (the contents of which are hereby incorporated by reference in their entirety) referred to as the Reweighted Zero-Attracting LMS (RZA-LMS) algorithm, improves the performance of the LMS algorithm in system identification of sparse systems. However, the algorithm requires the use of a very small value of step size in order to converge. There continues to be a need for improved adjustment in the step size in algorithms used by adaptive filters for system identification.

Thus, an adaptive filter for system identification solving the aforementioned problems is desired.

SUMMARY OF THE INVENTION

The adaptive filter for sparse system identification is an adaptive filter that uses an algorithm in the feedback loop that is designed to provide better performance when the unknown system model is sparse, i.e., when the filter has only a few non-zero coefficients, such as digital TV transmission channels and echo paths. In a first embodiment, the algorithm is the Normalized Least Mean Square (NLMS) algorithm in which the filter coefficients are updated at each iteration according to:

$$w(i+1) = w(i) + \mu(i)e(i)\frac{u^T(i)}{\|u(i)\|^2},$$

where the step size $\mu$ is varied according to $\mu(i+1)=\alpha\mu(i)+\gamma|e(i)|$. In a second embodiment, the algorithm is a Reweighted Zero Attracting LMS (RZA-LMS) algorithm in which the filter coefficients are updated at each iteration according to:

$$w(i+1) = w(i) + \mu(i)e(i)\frac{u^T(i)}{\|u(i)\|^2} - \rho\frac{\text{sgn}(w(i))}{1+\varepsilon|w(i)|},$$

where the step size $\mu$ is varied according to $\mu(i+1)=\alpha\mu(i)+\gamma|e(i)|$. The adaptive filter may be implemented on a digital signal processor (DSP), an ASIC, or by FPGAs.

These and other features of the present invention will become readily apparent upon further review of the following specification.

BRIEF DESCRIPTION OF THE DRAWINGS

Similar reference characters denote corresponding features consistently throughout the attached drawings.

DETAILED DESCRIPTION OF THE PREFERRED EMBODIMENTS

The adaptive filter for sparse system identification is an adaptive filter that uses an algorithm in the feedback loop that is designed to provide better performance when the unknown system model is sparse, i.e., when the filter has only a few non-zero coefficients, such as digital TV transmission channels and echo paths. In a first embodiment, the algorithm is the Normalized Least Mean Square (NLMS) algorithm in which the filter coefficients are updated at each iteration according to:

$$w(i+1) = w(i) + \mu(i)e(i)\frac{u^T(i)}{\|u(i)\|^2},$$

where the step size $\mu$ is varied according to $\mu(i+1)=\alpha\mu(i)+\gamma|e(i)|$. In a second embodiment, the algorithm is a Reweighted Zero Attracting LMS (RZA-LMS) algorithm in which the filter coefficients are updated at each iteration according to:

$$w(i+1) = w(i) + \mu(i)e(i)\frac{u^T(i)}{\|u(i)\|^2} - \rho\frac{\text{sgn}(w(i))}{1+\varepsilon|w(i)|},$$

where the step size $\mu$ is varied according to $\mu(i+1)=\alpha\mu(i)+\gamma|e(i)|$. The adaptive filter may be implemented on a digital signal processor (DSP), an ASIC, or by FPGAs.

Figure 1:
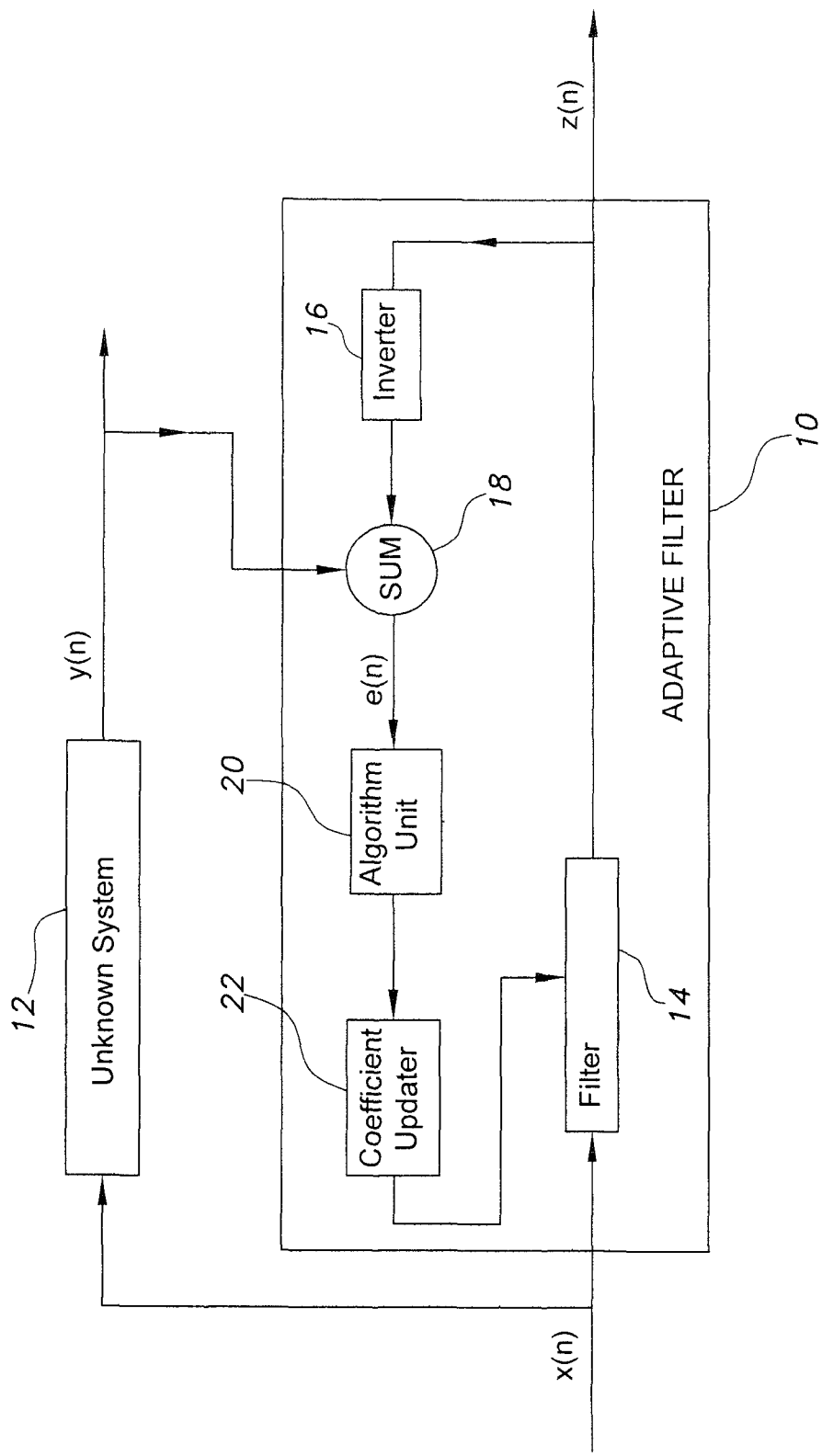
FIG. 1 is a block diagram of an adaptive filter for system identification according to the present invention.

FIG. 1 shows an exemplary adaptive filter for system identification, designated generally as 10 in the drawing, and how it may be connected to an unknown system 12. It will be understood that the configuration in FIG. 1 is exemplary, and that other configurations are possible. For example, the unknown system 12 may be placed in series at the input of the adaptive filter 10 and the adaptive filter 10 may be configured to produce a response that is the inverse of the unknown system response, the input signal being summed with the adaptive filter output after passing through a delay to produce an error feedback signal to the adaptive filter 10.

In the configuration shown in FIG. 1, a series of input signals x(n) (or equivalently, a single continuous input signal and corresponding output signal of the unknown system are sampled by the adaptive filter at a predetermined sampling rate) enter the unknown system and produce a series of output signals y(n). Each input signal x(n) is also input to the adaptive filter 10 and is processed by a filter 14, which is programmed or configured with a transfer function that produces a corresponding output signal z(n) that is an estimate of the desired signal. Assuming that the adaptive filter is implemented by a DSP, the filter 14 may be a Finite Impulse Response (FIR) filter or an Infinite Impulse Response (IIR) filter. The filter output signal z(n) is passed through an inverter 16 and is summed with the output signal y(n) of the unknown system 12 by summer 18 to produce an error signal e(n). The error signal e(n) is processed by an algorithm unit 20, which calculates corrections to the coefficients of the transfer function being implemented by the filter 14. The algorithm unit 20 passes the corrected coefficients to a coefficient updater circuit 22, which updates the coefficients of the transfer function, which are applied to the next succeeding input signal x(n) that is input to the filter 14. Gradually the feedback loop adjusts the transfer function until the adaptive filter 10 produces an output signal z(n) that correlates closely with the desired output signal y(n).

In a first embodiment, the algorithm applied by the algorithm unit 20 is a variation of the normalized least mean squares (NLMS) algorithm. Given the input row vector, u(i), to an unknown system, defined by a column vector w° of length M, then the output of the system, d(i), is given by:

$$d(i)=u(i)w°+v(i) \qquad (2)$$

where i is the time index and v(i) is the added noise. If the estimate at any time instant i, of w°, is denoted by the vector w(i), then the estimation error is given by:

$$e(i)=d(i)-u(i)w(i) \qquad (3)$$

The conventional normalized LMS (NLMS) algorithm is then given by:

$$w(i+1) = w(i) + \mu e(i)\frac{u^T(i)}{\|u(i)\|^2}, \qquad (4)$$

where T and |·| denote transposition and the Euclidean-norm, respectively, and $\mu$ is the step size, defined in the range $0<\mu<2$, that gives the NLMS algorithm a much flexible choice for the step size than the LMS algorithm, and specifically when the unknown system is large and sparse.

However, in the present adaptive filter, equation (4) is modified. Previous variable step size algorithms were all based on the $l_2$-norm of the error. For a sparse environment, a more suitable basis would be the $l_1$-norm. Therefore, the following variable step size recursion is applied:

$$\mu(i+1)=\alpha\mu(i)+\gamma|e(i)| \qquad (1)$$

where $\alpha$ and $\gamma$ are positive control parameters. It should be noted that $\alpha$ is a positive parameter ranging between 0 and 1, exclusively; i.e., $0<\alpha<1$. The parameter $\alpha$ slowly filters out the starting value of the step size $\mu$. Again, the $\gamma|e(i)|$ term of the step size update of equation (5) takes place using the $l_1$-norm, which gives the algorithm its desired performance in a sparse environment. Thus, the algorithm is a sparse variable step size NLMS (SVSSNLMS) algorithm in which the filter coefficient vector is given by:

$$w(i+1) = w(i) + \mu(i)e(i)\frac{u^T(i)}{\|u(i)\|^2} \quad (5)$$

and $\mu(i)$ is updated according to equation (5). This gives a wider range of choice in the step size than the conventional NLMS algorithm.

In a second embodiment, the algorithm unit 20 applies a modified version of the RZA-LMS algorithm proposed by Chen et al., discussed above. The $l_0$-norm in compressed sensing problems performs better than the $l_2$-norm in sparse environments. Since the use of the $l_0$-norm is not feasible, an approximation can be used instead (such as the $l_1$-norm). Thus, Chen et al. developed the Reweighted Zero Attracting LMS (RZA-LMS) algorithm, which is based on an approximation of the $l_0$-norm and is given by:

$$w_k(i+1) = w_k(i) + \mu e(i)u_k(i) - \rho\frac{\text{sgn}\{w_k(i)\}}{1 + \delta|w(i)|}, \quad (7)$$

which can be written in vector form as:

$$w(i+1) = w(i) + \mu e(i)u^T(i) - \rho\frac{\text{sgn}\{w(i)\}}{1 + \delta|w(i)|}, \quad (8)$$

where $\rho$ and $\delta$ are control parameters greater than 0 and sgn denotes the sign or signum function (an odd mathematical function that extracts the sign of a real number). The algorithm performs better than the standard LMS algorithm in sparse systems.

However, in the present adaptive filter, equation (8) is modified. Since convergence speed and low steady-state error are usually two conflicting parameters for an adaptive filter, the step size needs to be varied such that initially the convergence rate is fast, but as the algorithm approaches steady-state, the step size becomes small in order to give a low error response. Thus, the variable step size recursion of equation (5) is applied to form a variable step size RZA-LMS (VSSRZA-LMS) algorithm in which the filter coefficient vector is given by:

$$w(i+1) = w(i) + \mu(i)e(i)\frac{u^T(i)}{\|u(i)\|^2} - \rho\frac{\text{sgn}(w(i))}{1 + \varepsilon|w(i)|}, \quad (9)$$

and $\mu(i)$ is updated according to equation (5). As above, $\rho$ and $\epsilon$ are each control parameters greater than zero.

Figure 2:
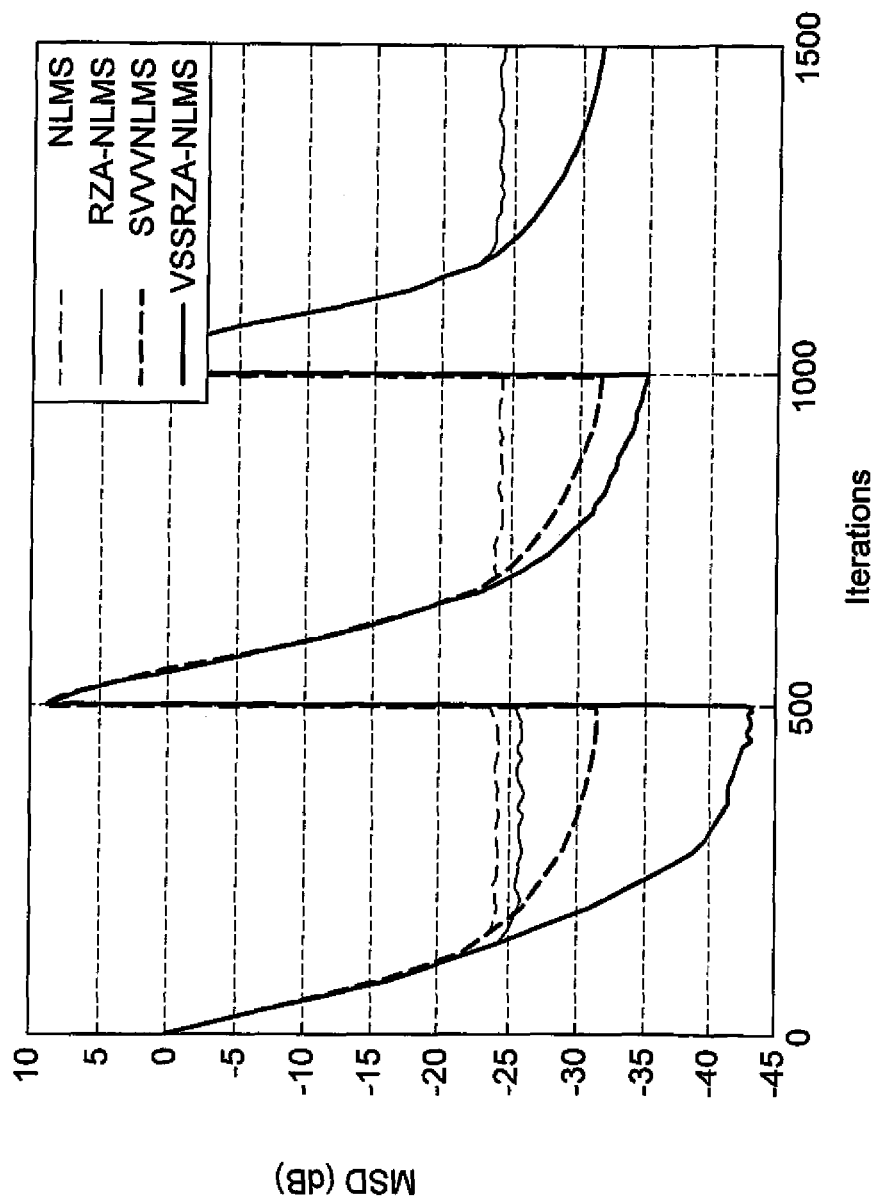
FIG. 2 is a plot of mean square deviation (MSD) vs. iterations, comparing performance of the two embodiments of the present adaptive filter for system identification against the Normalized Least Mean Square (NLMS) algorithm and the Reweighted Zero Attracting Normalized Least Mean Square (RZA-NLMS) algorithm for a simulated 16-tap system with varying sparsity and white input.

The two embodiments of the adaptive filter were tested by simulations using conventional computer software. Three scenarios are considered here. In the first one, the unknown system is represented by a 16-tap FIR filter. For the first 500 iterations, only one tap weight is non-zero. For the next 500 iterations, all odd numbered taps are 1 while the even numbered taps are zero. For the last 500 iterations, the even numbered taps are changed to −1. The input sequence is zero-mean Gaussian with variance 1. The value for μ is taken as 0.5 for both the NLMS and the RZA-NLMS algorithms while μ(0) is 0.5 for the VSS algorithms. The value for ρ is taken as 5e-4 for both the RZA-NLMS algorithm as well as the proposed VSSRZA-NLMS algorithm. The values for the step size control parameters are chosen as α=0.99 and γ=0.01 for both the VSS algorithms. Results are shown for a signal-to-noise ratio (SNR) of 20 dB. As depicted in FIG. 2, the proposed algorithms clearly outperform both fixed step size algorithms.

Figure 3:
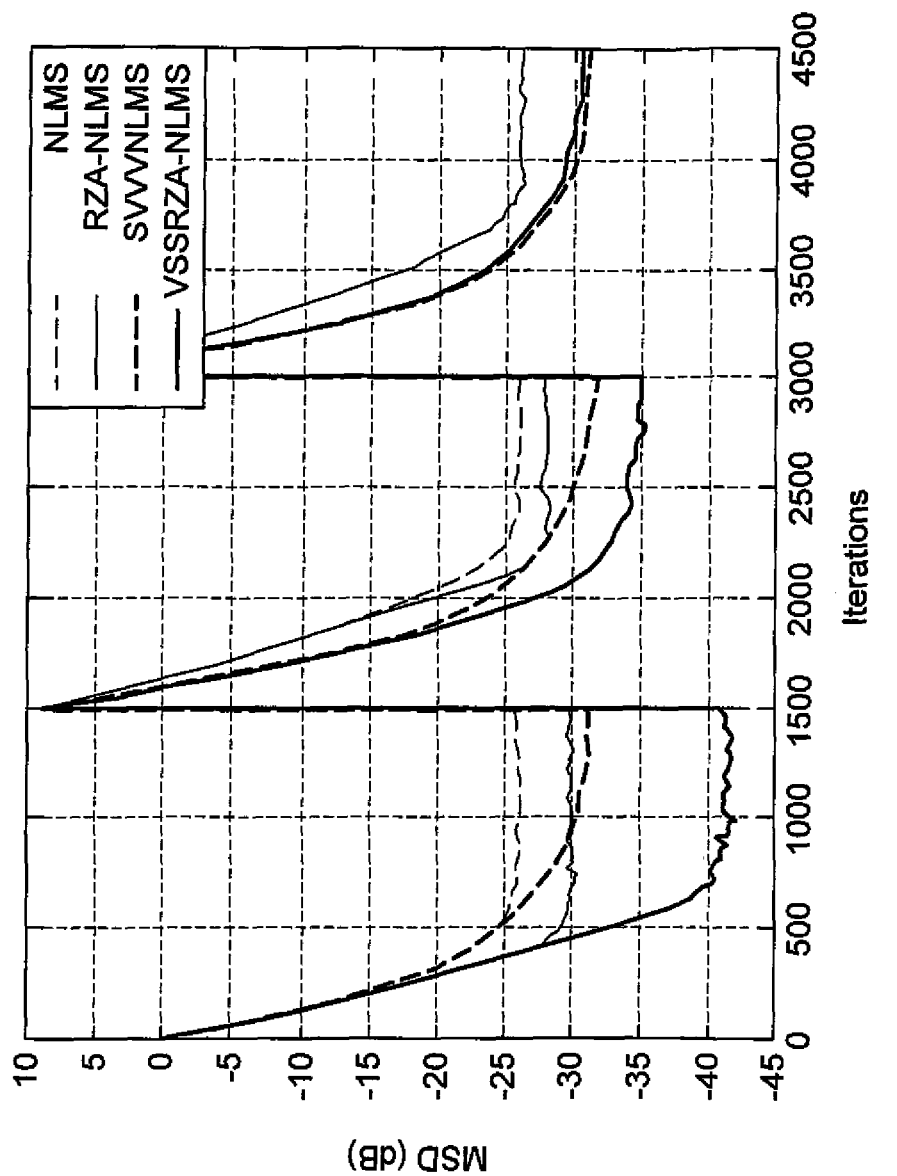
FIG. 3 is a plot of mean square deviation (MSD) vs. iterations, comparing performance of the two embodiments of the present adaptive filter for system identification against the Normalized Least Mean Square (NLMS) algorithm and the Reweighted Zero Attracting Normalized Least Mean Square (RZA-NLMS) algorithm for a simulated 16-tap system with varying sparsity and correlated input.

The second experiment is performed with the same unknown system as the first experiment. However, the input in this case is modeled by u(i)=0.8u(i−1)+x(i), where x(i) is a zero-mean random sequence with variance 1. The variance of the resulting sequence is normalized to 1. The values for μ and Q are taken to be the same as before. The value for γ is same as in the previous case while α=0.995 for both algorithms. The unknown system is modified slightly such that the three variants are now 1500 iterations each instead of 500 iterations as previously. The results are reported in FIG. 3. The difference in performance of the proposed algorithms compared with the previous algorithms is less in this case. However, the proposed algorithms clearly outperform the previous algorithms.

Figure 4:
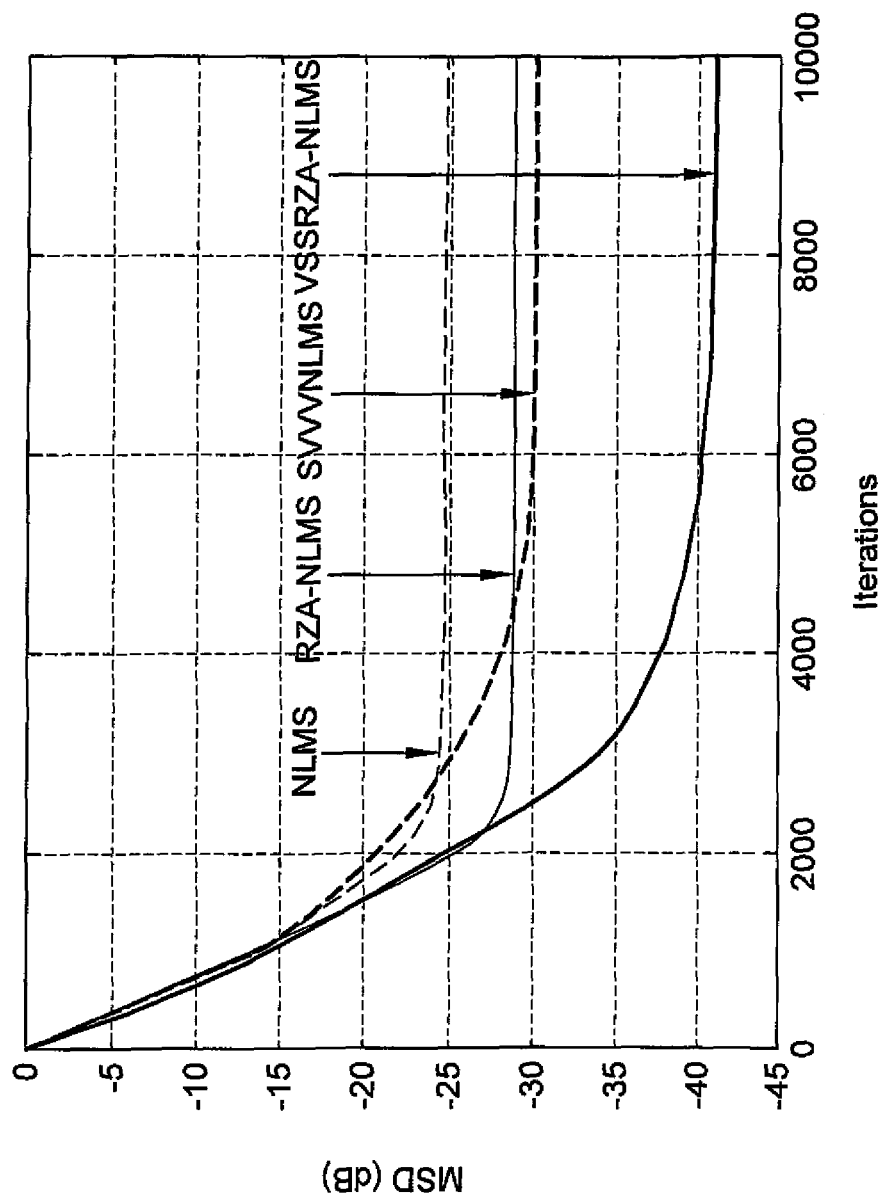
FIG. 4 is a plot of mean square deviation (MSD) vs. iterations, comparing performance of the two embodiments of the present adaptive filter for system identification against the Normalized Least Mean Square (NLMS) algorithm and the Reweighted Zero Attracting Normalized Least Mean Square (RZA-NLMS) algorithm for a simulated 256-tap system with white input.

In the third scenario, the unknown system is modeled using a 256-tap FIR filter with only 28 taps being non-zero. The value for μ is kept the same as previously, showing that the normalization factor makes the algorithms independent of the filter length. The value for ρ is changed to 1 e-5. The values for α and γ are kept the same as the first experiment. As can be seen from FIG. 4, the proposed algorithms outperform the previous algorithms, even at low SNR value.

It is to be understood that the present invention is not limited to the embodiments described above, but encompasses any and all embodiments within the scope of the following claims.

We claim:

1. A method of adaptive filtering for sparse system identification of an unknown system where the unknown system is sparse, comprising the steps of:
   tapping input signals to the unknown system;
   inputting the tapped input signals to a digital filter, the digital filter implementing a transfer function to produce corresponding output signals;
   tapping output signals of the unknown system corresponding to the input signals;
   summing the output signals of the unknown system with the inverse of the corresponding output signals of the digital filter to produce a feedback error signal;
   processing the feedback error signal with a least mean square algorithm having a variable step size computed according to:

$$\mu(i+1) = \alpha\mu(i) + \gamma|e(i)|$$

where μ is the step size, α and γ are positive control parameters subject to 0<α<1, e is the estimation error, and i is an index correlating the input signal and output signals in order to recalculate coefficients of the transfer function; and
   updating the transfer function applied by the digital filter with the recalculated coefficients for application to the next succeeding input signal.

2. The method of adaptive filtering according to claim 1, wherein the digital filter is a finite impulse response (FIR) filter.

3. The method of adaptive filtering according to claim 1, wherein the digital filter is an infinite impulse response (IIR) filter.

4. The method of adaptive filtering according to claim 1, wherein the least mean square algorithm is a sparse variable step size normalized least mean square algorithm (NLMS) and the algorithm produces a filter coefficient vector according to:

$$w(i+1) = w(i) + \mu(i)e(i)\frac{u^T(i)}{\|u(i)\|^2}$$

where w is the filter coefficient vector, u is the input row vector of the unknown system, T is the transposition function, and |·| denotes the Euclidean-norm.

5. The method of adaptive filtering according to claim 1, wherein the least mean square algorithm is a variable step size RZA-LMS (VSSRZA-LMS) algorithm and the algorithm produces a filter coefficient vector according to:

$$w(i+1) = w(i) + \mu(i)e(i)\frac{u^T(i)}{\|u(i)\|^2} - \rho\frac{\text{sgn}(w(i))}{1+\varepsilon|w(i)|},$$

where w is the filter coefficient vector, u is the input row vector of the unknown system, T is the transposition function, $\rho$ and $\epsilon$ are each control parameters greater than zero, sgn represents the sign function, and |·| denotes the Euclidean-norm.

* * * * *